(12) United States Patent
Gong et al.

(10) Patent No.: US 9,362,171 B2
(45) Date of Patent: Jun. 7, 2016

(54) THROUGH VIA CONTACTS WITH INSULATED SUBSTRATE

(71) Applicant: GLOBALFOUNDRIES Singapore Pte. Ltd., Singapore (SG)

(72) Inventors: Shunqiang Gong, Singapore (SG); Juan Boon Tan, Singapore (SG); Wei Liu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/140,553

(22) Filed: Dec. 26, 2013

(65) Prior Publication Data

US 2015/0187647 A1 Jul. 2, 2015

(51) Int. Cl.
| | |
|---|---|
| H01L 21/44 | (2006.01) |
| H01L 21/768 | (2006.01) |
| H01L 21/48 | (2006.01) |
| H01L 21/683 | (2006.01) |
| H01L 23/522 | (2006.01) |
| H01L 23/00 | (2006.01) |
| H01L 25/065 | (2006.01) |

(52) U.S. Cl.
CPC ........ *H01L 21/76898* (2013.01); *H01L 21/486* (2013.01); *H01L 21/6835* (2013.01); *H01L 21/76831* (2013.01); *H01L 21/76871* (2013.01); *H01L 21/76877* (2013.01); *H01L 21/76892* (2013.01); *H01L 23/522* (2013.01); *H01L 24/05* (2013.01); *H01L 24/06* (2013.01); *H01L 24/11* (2013.01); *H01L 24/13* (2013.01); *H01L 24/16* (2013.01); *H01L 25/0657* (2013.01); *H01L 2221/6834* (2013.01); *H01L 2221/68327* (2013.01); *H01L 2224/03002* (2013.01); *H01L 2224/0401* (2013.01); *H01L 2224/0557* (2013.01); *H01L 2224/06181* (2013.01); *H01L 2224/11002* (2013.01); *H01L 2224/131* (2013.01); *H01L 2224/13022* (2013.01); *H01L 2224/16145* (2013.01); *H01L 2224/94* (2013.01); *H01L 2225/06513* (2013.01); *H01L 2225/06541* (2013.01); *H01L 2924/10253* (2013.01); *H01L 2924/10271* (2013.01); *H01L 2924/14* (2013.01); *H01L 2924/1434* (2013.01); *H01L 2924/1436* (2013.01); *H01L 2924/1437* (2013.01)

(58) Field of Classification Search
CPC .................. H01L 21/76898; H01L 21/76243; H01L 21/2007; H01L 21/76251
USPC ........... 257/621, E21.563, E21.567; 438/459, 438/667
See application file for complete search history.

(56) References Cited

U.S. PATENT DOCUMENTS

| | | | | |
|---|---|---|---|---|
| 5,646,067 | A * | 7/1997 | Gaul | 438/458 |
| 8,415,771 | B1 * | 4/2013 | Golda et al. | 257/621 |
| 2008/0290525 | A1 * | 11/2008 | Anderson et al. | 257/774 |
| 2011/0233785 | A1 * | 9/2011 | Koester et al. | 257/773 |

* cited by examiner

*Primary Examiner* — Robert Huber
(74) *Attorney, Agent, or Firm* — Horizon IP Pte. Ltd.

(57) ABSTRACT

Device and a method of forming a device are disclosed. The method includes providing a crystalline-on-insulator (COI) substrate. The COI substrate includes at least a base substrate over a buried insulator layer. Through via (TV) contacts are formed within the substrate. The TV contact extends from a top surface of the base substrate to within the buried insulator layer. Upper interconnect levels are formed over the top surface of the base substrate. A lower redistribution (RDL) is formed over a bottom surface of the base substrate. The buried insulator layer corresponds to a first RDL dielectric layer of the lower RDL and protects the sidewalls of the TV contacts.

20 Claims, 8 Drawing Sheets

THROUGH VIA CONTACTS WITH INSULATED SUBSTRATE

BACKGROUND

Through vertical interconnect access (via) is a vertical electrical connection passing completely through a silicon wafer or die. Through-silicon via (TSV) demonstrates a high performance technique used to create smaller packages and integrated circuits by allowing 2.5-dimensional (2.5D) interposer or 3-dimensional (3D) package wafer integration schemes. TSV integration improves physical scaling limitations while delivering greater performance and functionality. However, the current implementation of TSV designs still face manufacturing challenges.

From the foregoing discussion, it is desirable to provide a TSV integration scheme that is more robust, simplified and reliable.

SUMMARY

Embodiments generally relate to device and method of forming a device. In one embodiment, a method of forming a device is presented. The method includes providing a substrate. The substrate includes a buried oxide (BOX) layer sandwiched by a base substrate and a bottom substrate. A dielectric layer is formed on the base substrate. Through via (TV) contacts are formed within the substrate. The TV contacts extend from a top surface of the dielectric layer to within the BOX layer of the substrate. Upper interconnect levels are formed on the base substrate over a top surface of the TV contacts. The dielectric layer separates the upper interconnect levels from the base substrate. A carrier substrate is provided over a top surface of the upper interconnect levels. The bottom substrate and a portion of the BOX layer are removed to expose a bottom surface of the TV contacts. The remaining BOX layer serves as a first redistribution (RDL) dielectric layer of a lower RDL of the device.

In another embodiment, a method of forming a device is disclosed. The method includes providing a crystalline-on-insulator (COI) substrate. The COI substrate includes at least a base substrate over a buried insulator layer. Through via (TV) contacts are formed within the substrate. The TV contact extends from a top surface of the base substrate to within the buried insulator layer. Upper interconnect levels are formed over the top surface of the base substrate. A lower redistribution (RDL) is formed over a bottom surface of the base substrate. The buried insulator layer corresponds to a first RDL dielectric layer of the lower RDL and protects the sidewalls of the TV contacts.

In yet another embodiment, a device is disclosed. The device includes a crystalline-on-insulator (COI) substrate. The COI substrate includes at least a base substrate over a buried insulator layer. Through via (TV) contacts are disposed within the substrate. The TV contact extends from a top surface of the base substrate to within the buried insulator layer. The device includes upper interconnect levels disposed over the top surface of the base substrate, and a lower redistribution (RDL) over a bottom surface of the base substrate. The buried insulator layer corresponds to a first RDL dielectric layer of the lower RDL and protects the sidewalls of the TV contacts.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to devices, such as semiconductor devices or ICs. Other types of devices may also be useful. The devices can be any type of IC, for example dynamic or static random access memories, signal processors, or system-on-chip (SoC) devices. The devices can be incorporated into, for example, consumer electronic products, such as computers, cell phones, and personal digital assistants (PDAs). Incorporating the devices in other applications may also be useful.

Figure 1:
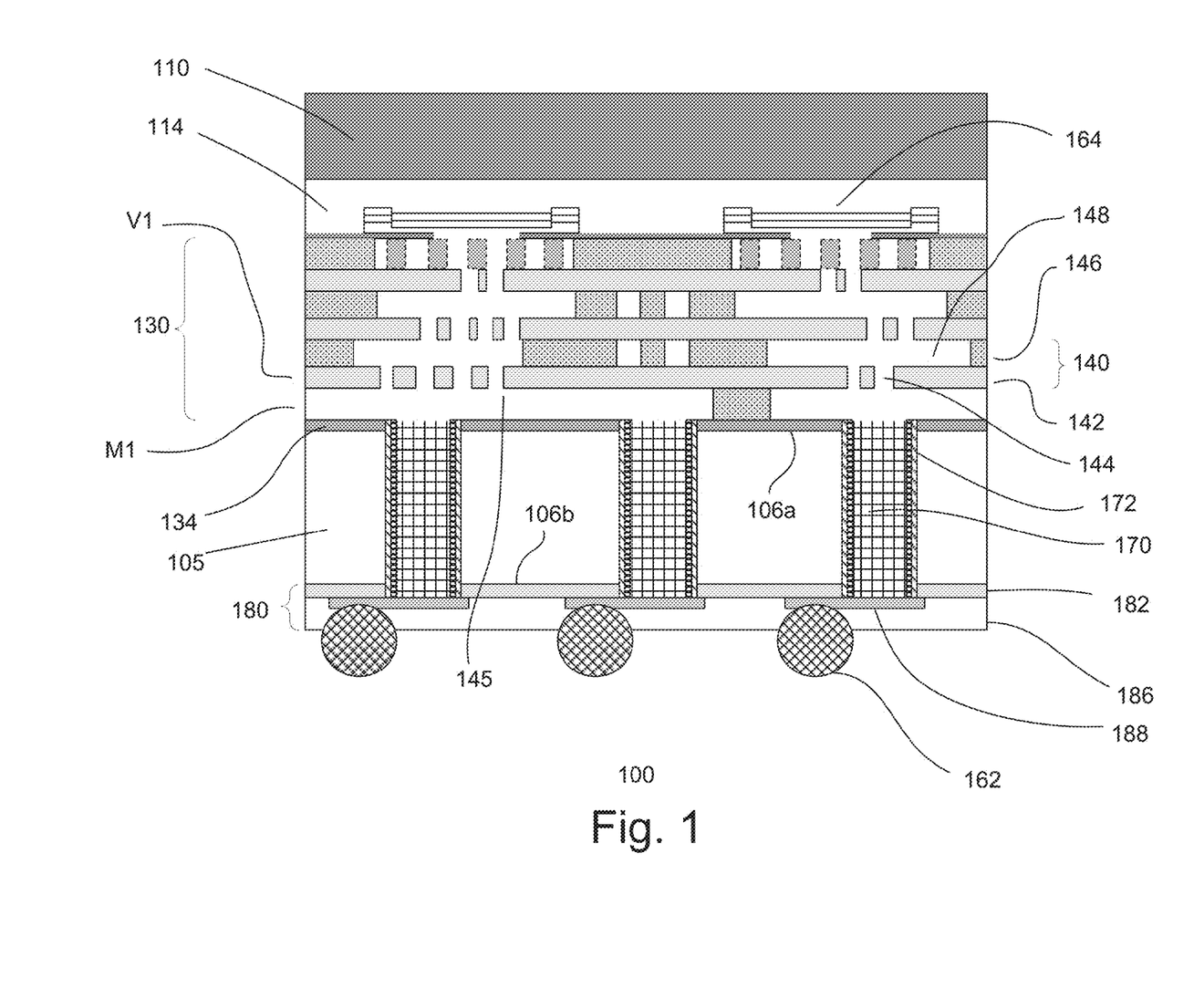
FIG. 1 shows an embodiment of a device.

FIG. 1 shows a simplified cross-sectional view of an embodiment of a portion of a device 100. The portion of the device includes a base substrate 105. The base substrate, for example, is a semiconductor substrate. For example, the substrate is a silicon substrate. Other types of base substrates, such as silicon germanium, are also useful. In one embodiment, the base substrate is part of a crystalline-on-insulator (COI) substrate, such as silicon-on-insulator (SOI) substrate. The SOI substrate may be purchased as a SOI substrate fabricated by device manufacturer. The base substrate, for example, may be wafer. For example, a plurality of devices are formed on the wafer in parallel. After the wafer has finished processing, it is diced to singulate the devices.

The substrate includes first and second opposing major surfaces 106*a*-106*b*. The first major surface may be referred to as the top surface and the second surface may be referred to as the bottom surface. Other designations may also be useful. For example, designating the top surface as the front side and bottom surface as the back side may also be useful. In one embodiment, the device is an integrated circuit (IC). In the case of an IC, circuit components (not shown) such as transistors, may be formed on the first or top major surface. Other types of circuit components are also useful.

Upper interconnects are provided on the substrate. In the case of an IC, the upper interconnects are provided to electrically couple the circuit components as desired to form the device. The interconnects are, for example, provided in a plurality of upper interconnect levels 130 disposed on the substrate. Interconnects are formed in an intermetal dielectric (IMD) layer 140. An IMD layer includes a trench level 146 in an upper portion which corresponds to a metal level (Mx). For example, interconnects or metal lines 148 are disposed in the trench level of the IMD layer. A lower portion of the IMD layer includes a via level (Vx−1) 142, such as V1, having contacts 144. A metal level Mx includes a via level Vx−1 below, where x is from 1 to n (e.g., 1 is the lowest and n is the highest level).

The contacts of Vx−1 couple the interconnects of Mx to contact areas or regions below. Depending on the level, the contact regions can be, for example, other interconnects on Mx−1. For example, in the case where x is ≥2 (M2 or above), the contact areas may be interconnects (e.g., 145 of MD. In some cases, the contact area may be active device regions, such as diffusion regions of transistors and transistor gates, as well as other types of regions. For example, in the case where x=1 (M1), the contacts are in a premetal dielectric (PMD) level and the contact areas include active device regions.

It is understood that the different IMD levels need not be the same. For example, different materials or construction may be employed for different IMD levels. Also, thicknesses as well as design rules, such as line widths may also be different. Generally, the higher the level, the wider the lines. Other configurations of IMD levels are also useful. Also, the lower level (e.g., MD is formed by, for example, a single damascene process while the upper interconnect levels (M2 and above) are formed by, for example, a dual damascene process. Other suitable techniques may also be employed.

The conductive lines and contacts are formed of a conductive material. The conductive material may be any metal or alloy. For example, the conductive material may be copper, aluminum, tungsten, their alloys, or a combination thereof. Other types of conductive materials may also be useful. The interconnects and contacts may be formed of the same or similar type of materials. Forming the interconnects and contacts using different types of conductive materials may also be useful. For example, the contacts may be tungsten while the interconnects may be copper. Such a configuration may be useful for PMD and M1 levels. In the case where the contacts and interconnects are formed of the same material, they are preferably formed of copper. Other configurations of interconnects and contacts may also be useful.

The conductive line and/or contact may be provided with vertical or substantially vertical sidewalls. Alternatively, the conductive lines and/or contacts are provided with slanted sidewalls. The slanted sidewall profile can improve sidewall barrier and seed coverage during processing. The slanted sidewalls, for example, include an angle of about 85-89°.

Upper contacts 164, for example, are disposed over the top metal level. In the case of an IC, there may be six metal levels (n=6). For example, the top metal level may be M6. Providing other top metal levels may also be useful. The upper contacts, for example, may be contact pads. The upper contacts, for example, include any suitable conductive material. The contact pads facilitate stacking. For example, another device may be stacked over the device. For example, another IC may be stacked over the IC.

A carrier substrate 110 is disposed on the top of the upper interconnection levels. The carrier substrate, for example, is temporarily attached to the base substrate (e.g., top of the upper interconnect levels) by an adhesive 114. Any suitable adhesive may be used. The carrier substrate facilities processing of the base substrate. For example, the carrier substrate is provided on the top of the upper interconnect levels after processing of the front side of the substrate has been completed. This maintains mechanical integrity and facilitates processing of the back side of the base substrate. After processing of the base substrate is completed, it is removed.

In an alternative embodiment, the device may be an interposer. For example, the base substrate serves as an interposer. In the case of an interposer, no circuit elements are formed on top of the substrate surface. In some cases, passive circuit elements may be provided. The upper interconnect levels may be referred to as an upper redistribution (RDL) layer. In the case of an interposer, the number of interconnect levels may be less. For example, there may be four interconnect levels for an interposer. The upper contacts may provide connections for one or more devices mounted thereon.

A lower RDL 180 is disposed on the second major surface of the base substrate. For example, the lower RDL is disposed on the bottom surface of the base substrate. In one embodiment, the lower RDL is a lower RDL stack. As shown, the lower RDL stack includes first and second RDL dielectric layers 182 and 186. The first RDL dielectric layer 182 contacts the bottom substrate surface while the second RDL dielectric layer 186 is disposed on the first RDL dielectric layer. The first RDL dielectric layer, for example, is silicon oxide while the second RDL dielectric layer is nitride, etc. Other suitable types of dielectric materials for the dielectric layers may also be useful. Disposed on the first RDL dielectric layer are conductive traces 188. Lower contacts 162 are disposed in openings of the second RDL dielectric layer, coupling to the conductive traces. The lower contacts, for example, may be solder bumps or balls. Other types of lower contacts may also be useful.

In one embodiment, through via (TV) contacts 170 are disposed in the substrate. The through via contacts, as shown, are through silicon via (TSV) contacts. The TV contacts extend through the first and second base substrate major surfaces. For example, the TV contacts extend through the top and bottom base substrate surfaces. The TV contacts may be copper TV contacts. Other suitable types of conductive materials may also be useful for the TV contacts. A TV liner 172 lines the TV contacts. The TV liner may include multiple layers. In one embodiment, the TV liner includes a TV isolation liner and a TV seed layer, such as a copper seed layer. Other types of liner configurations may also be useful.

A top surface of the TV contacts, as shown, extends through a top dielectric layer 134 and connects to M1. A bottom surface of the TV contacts extends through the lower RDL dielectric layer and connects to a conductive trace on the first RDL dielectric layer. This facilitates electrical connections from the upper contact pads to the lower contacts.

In one embodiment, the first RDL dielectric layer is part of a COI substrate. For example, TV contacts are formed in the COI substrate. Providing the first RDL dielectric layer as part of a COI substrate facilitates forming the TV contacts. For example, the oxide layer of the COI substrate serves as an etch or CMP stop to expose the bottom TV contact surface. The stop layer provides a planar bottom surface while remaining as isolation between TV contacts and for forming conductive traces of the lower RDL layer.

Figure 2A:
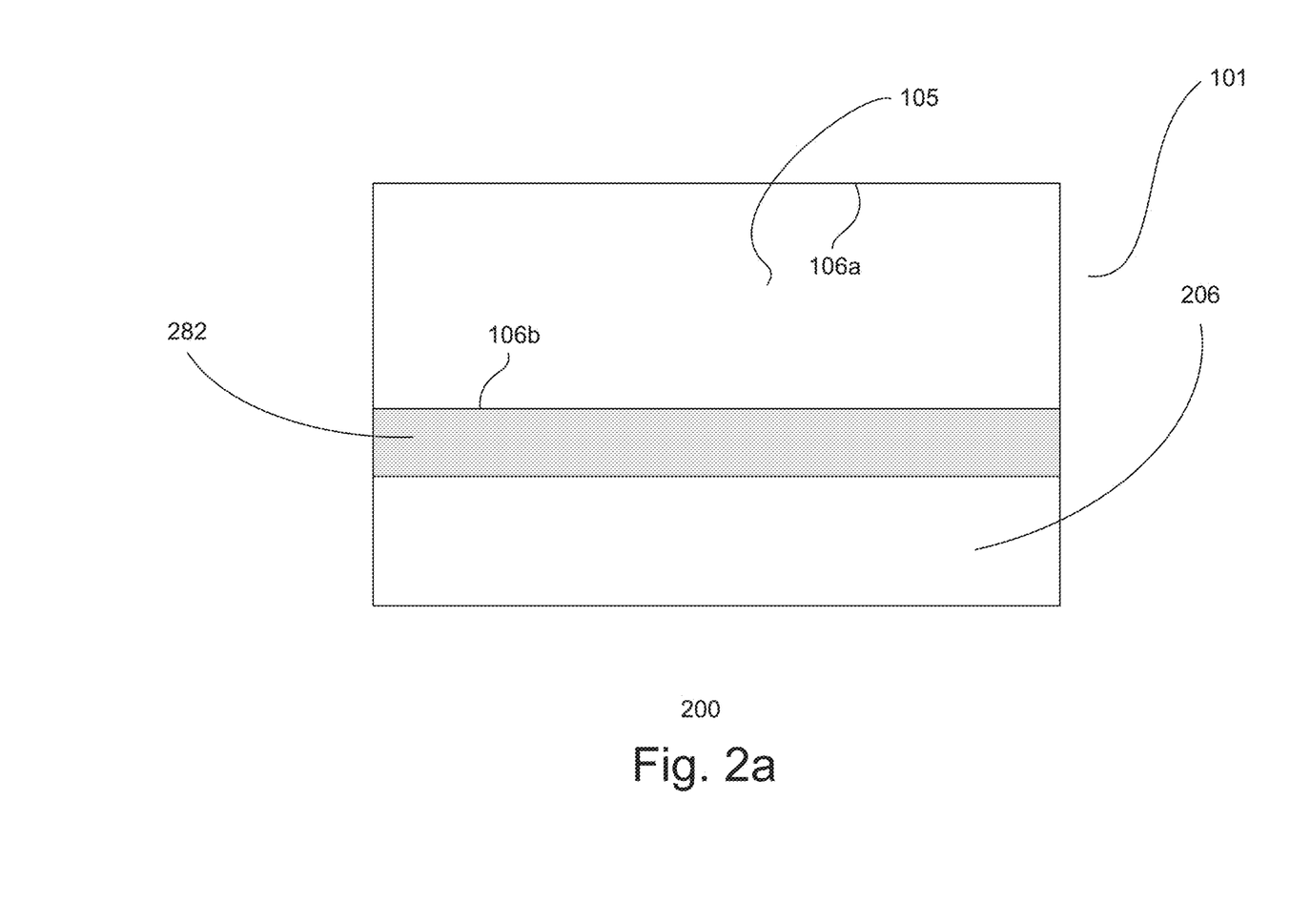
FIGS. 2*a*-2*g* show an embodiment of a process of forming a device.

FIGS. 2a-2g show an embodiment of a process for forming a device 200. The device formed is similar to that described in FIG. 1. Common elements may not be described or described in detail. As shown in FIG. 2a, a substrate 101 is provided. The substrate, for example, is a COI substrate. For example, the COI substrate is a SOI substrate. Other types of COI substrates may also be useful. The COI substrate may be provided by a wafer manufacturer or produced by a device manufacturer. In one embodiment, the COI substrate includes a buried oxide (BOX) layer 282 sandwiched by a base substrate 105 and a bottom substrate 206. The base substrate includes first and second opposing major surfaces 106a-106b. The first major surface may be referred to as the top surface and the second surface may be referred to as the bottom surface. Other designations may also be useful.

Figure 2B:
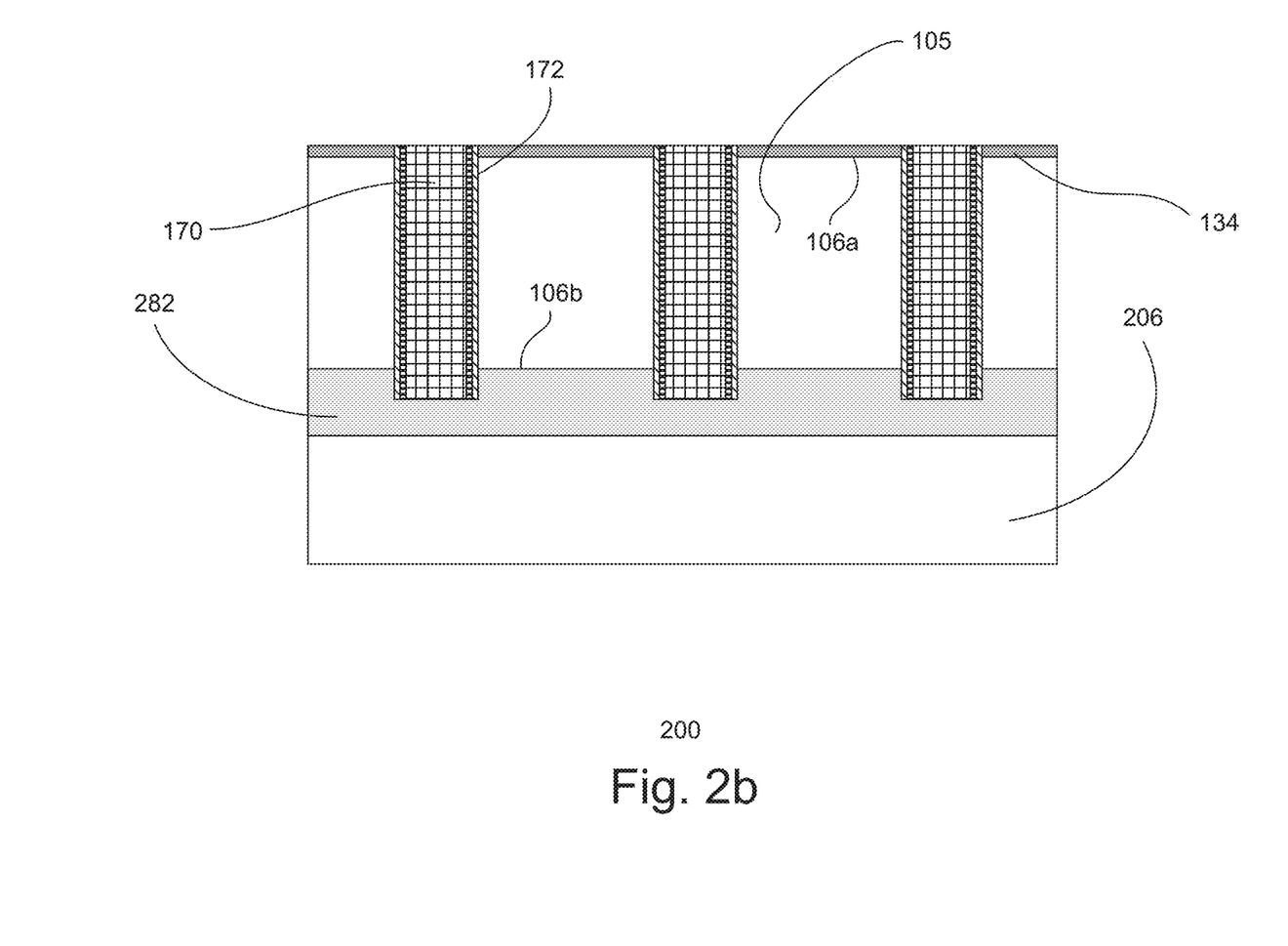

Referring to FIG. 2b, the substrate is processed to form TV contacts. For example, a dielectric layer 134 is provided over the substrate surface. The dielectric layer, for example, may be a silicon oxide layer. Other types of dielectric layer may also be useful. The dielectric layer, for example, serves as a first contact or via level layer. This may be the PMD layer. TV contacts 170 are formed. The TV contacts extend from the top surface of the dielectric layer to within the BOX layer of the COI substrate. For example, it should extend to at least a thickness of the first lower RDL dielectic layer within the BOX layer.

To form the TV contacts, through vias (TVs) are formed in the substrate. The depth of the TVs is equal to about the depth of the TV contacts. For example, the TV extends to within the BOX layer. A TV liner 172 is formed, lining the TVs and substrate. The TV liner may be a liner stack. The liner stack may include a TV isolation layer, such as oxide followed by a seed layer, such as a copper seed layer. Other types of liners or configurations of liners may also be useful. A conductive material, such as copper, fills the TVs. For example, the TVs are filled by electroplating. Other techniques for filling the TVs may also be useful. A planarizing process, such as chemical mechanical polishing (CMP), is performed to remove excess fill material and to provide a co-planar top surface with the dielectric layer and top surface of the TV contacts.

Figure 2C:
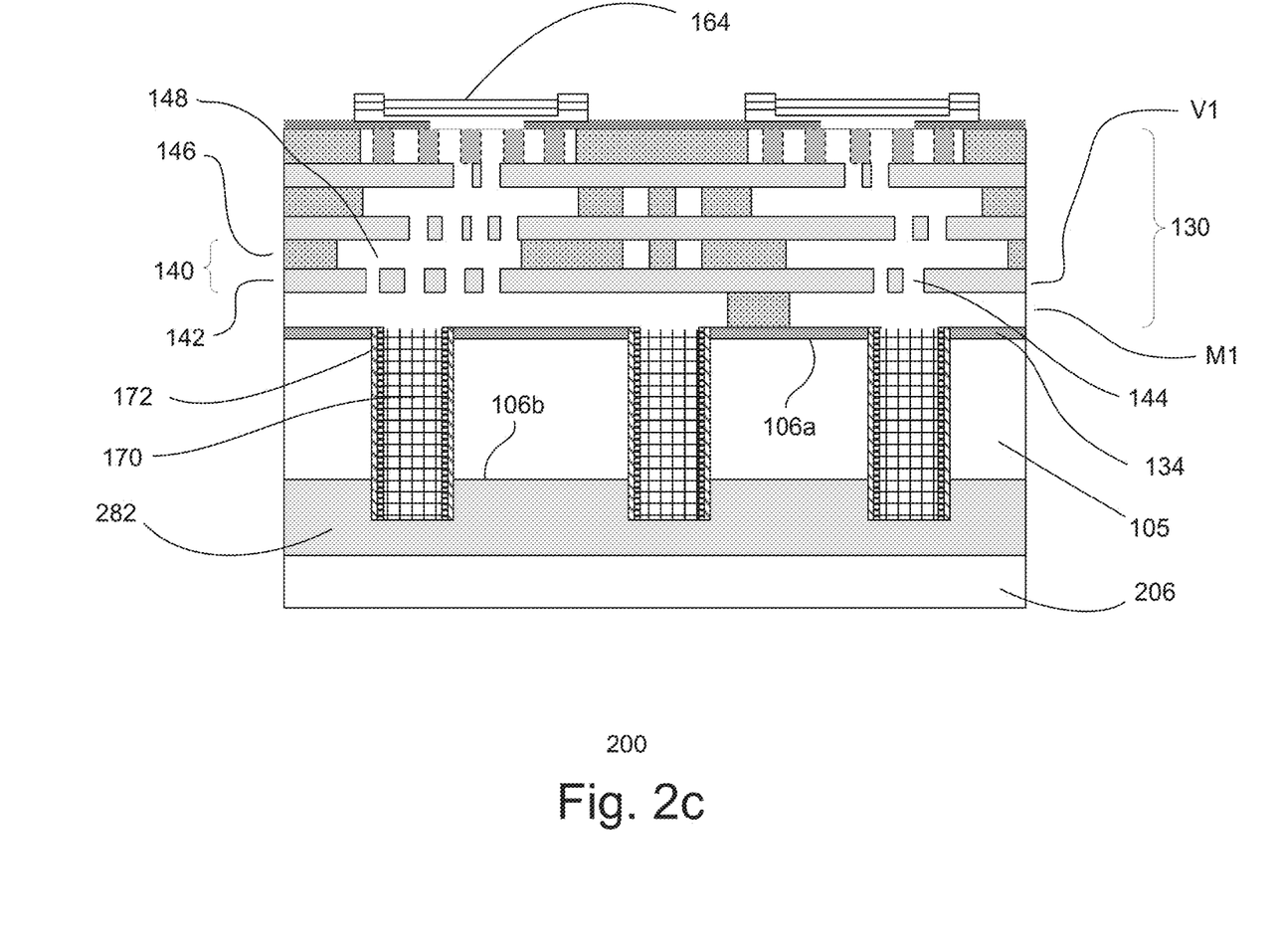

Referring to FIG. 2c, the process continues to form upper interconnects. The upper interconnects are, for example, provided in a plurality of upper interconnect levels 130 disposed on the substrate. As shown, the interconnect levels include M1 to Mn, where 1 is the lowest interconnect level and n is the highest interconnect level. Providing any suitable number of metal levels in the interconnect levels may be useful.

Interconnects are formed in an intermetal dielectric (IMD) layer 140. An IMD layer includes a trench level 146 in an upper portion which corresponds to the metal level (Mx). For example, interconnects or metal lines 148 are formed in the trench level of the IMD layer. A lower portion of the IMD layer includes a via level (Vx−1) 142, such as V1, having via contacts 144. A metal level Mx includes a via level Vx−1 below, where x is from 1 to n.

It is understood that the different IMD levels need not be the same. For example, different materials or construction may be employed for different IMD levels. Also, thicknesses as well as design rules, such as line widths may also be different. Generally, the higher the level, the wider the lines. Other configurations of IMD levels are also useful. Also, the lower level (e.g., MD is formed by, for example, a single damascene process while the upper interconnect levels (M2 and above) are formed by, for example, a dual damascene process. Other suitable techniques may be employed.

The conductive lines and contacts are formed of a conductive material using suitable deposition techniques followed by CMP process. The conductive material may be any metal or alloy. For example, the conductive material may be copper, aluminum, tungsten, their alloys, or a combination thereof. Other types of conductive materials may also be useful. The interconnects and contacts may be formed of the same or similar type of materials. Forming the interconnects and contacts using different types of conductive materials may also be useful. For example, the contacts may be tungsten while the interconnects may be copper. Such a configuration may be useful for PMD and M1 levels. In the case where the contacts and interconnects are formed of the same material, they are preferably formed of copper. Other configurations of interconnects and contacts may also be useful.

The conductive line and/or contact may be provided with vertical or substantially vertical sidewalls formed through the different dielectric layers using suitable mask and etch techniques. Alternatively, the conductive lines and/or contacts are provided with slanted sidewalls. The slanted sidewall profile can improve sidewall barrier and seed coverage during processing. The slanted sidewalls, for example, include an angle of about 85-89°. The process continues until the upper interconnect is formed according to the desired interconnect level and upper contacts 164 are formed. Upper contacts 164, for example, are formed over the top metal level. As shown in FIG. 2c, the upper contacts, for example, may be contact pads. The upper contacts may include suitable conductive material and may be formed by suitable deposition techniques. The contact pads facilitate stacking. For example, another device may be stacked over the device.

Figure 2D:
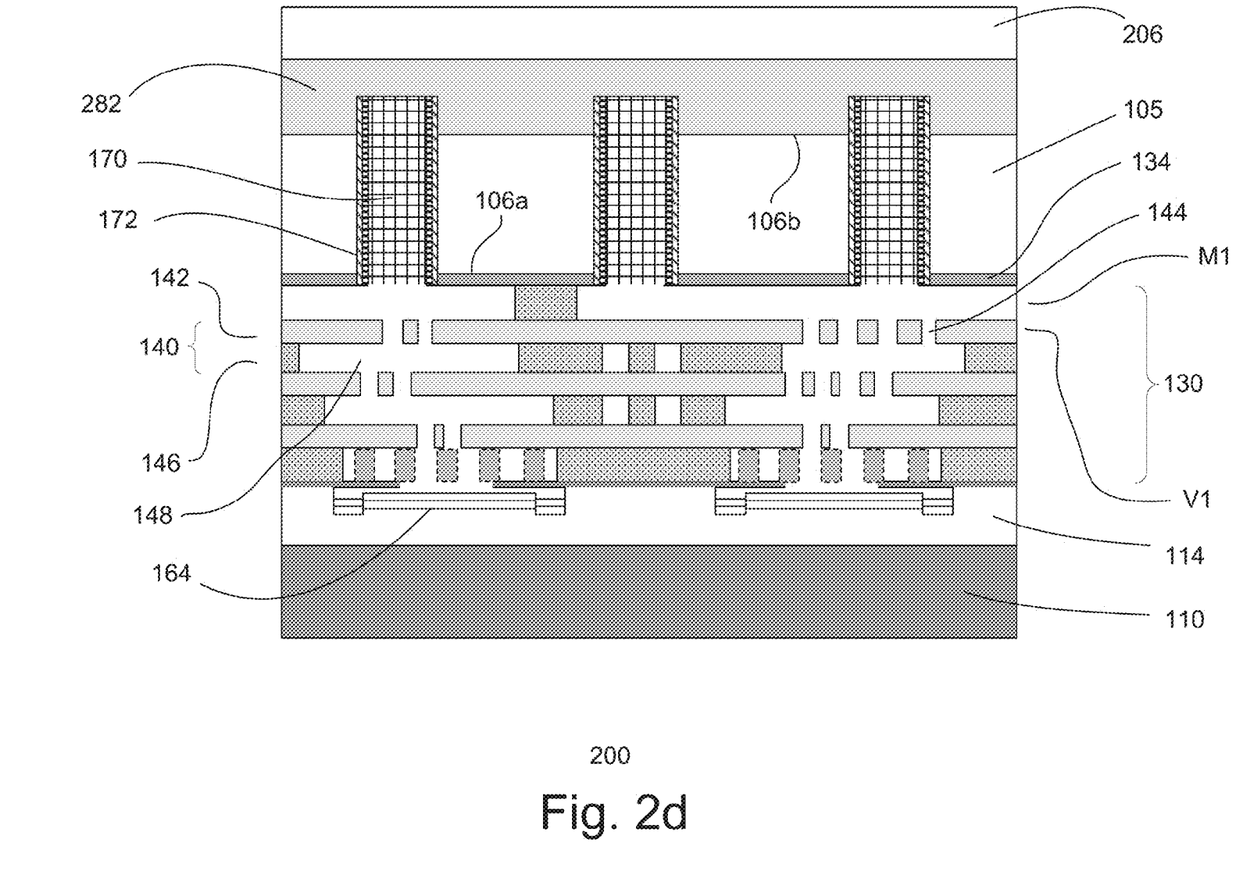

Referring to FIG. 2d, a carrier substrate 110 is temporarily attached to the top of the upper interconnect levels. For example, an adhesive 114 may be used to temporarily attach the carrier substrate. Any suitable adhesive may be employed. The carrier substrate facilitates processing of the back side of the substrate. The carrier substrate can be any suitable types of carrier substrate which provides mechanical support for processing of the back side of the substrate. The carrier substrate, for example, can be any suitable low cost wafer or other suitable types of wafer substrate which can be reused after processing of the back side of the substrate. The process continues by flipping the substrate to enable processing of the back side of the substrate.

Figure 2E:
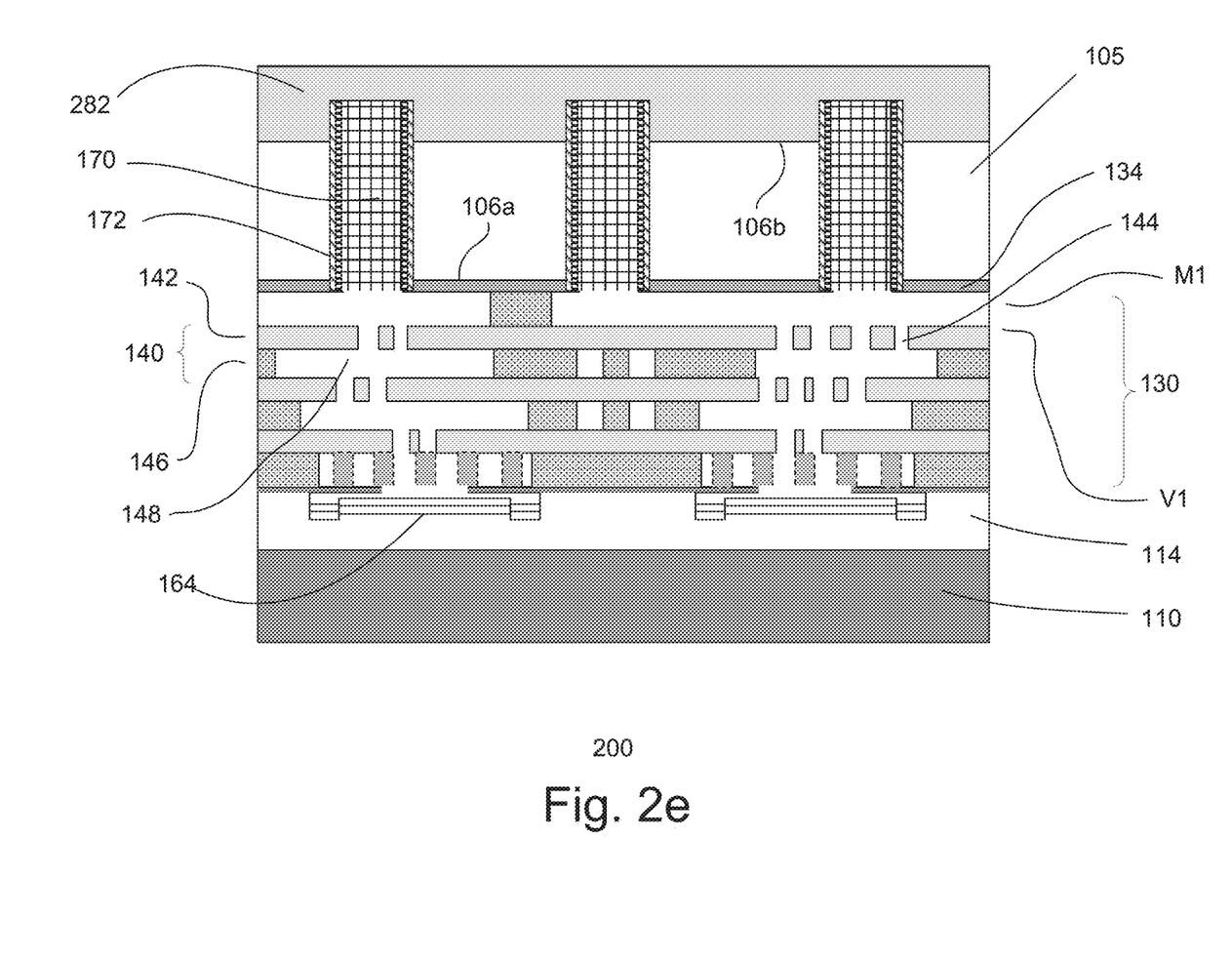

Referring to FIG. 2e, the bottom substrate 206 is removed. For example, the bottom substrate may be removed by an etch, such as a reactive ion etch (RIE). Alternatively, the bottom substrate may be removed by a backgrinding process. Other suitable techniques for removing the bottom substrate may also be useful. Removal of the bottom substrate exposes the bottom surface of the BOX layer 282.

Figure 2F:
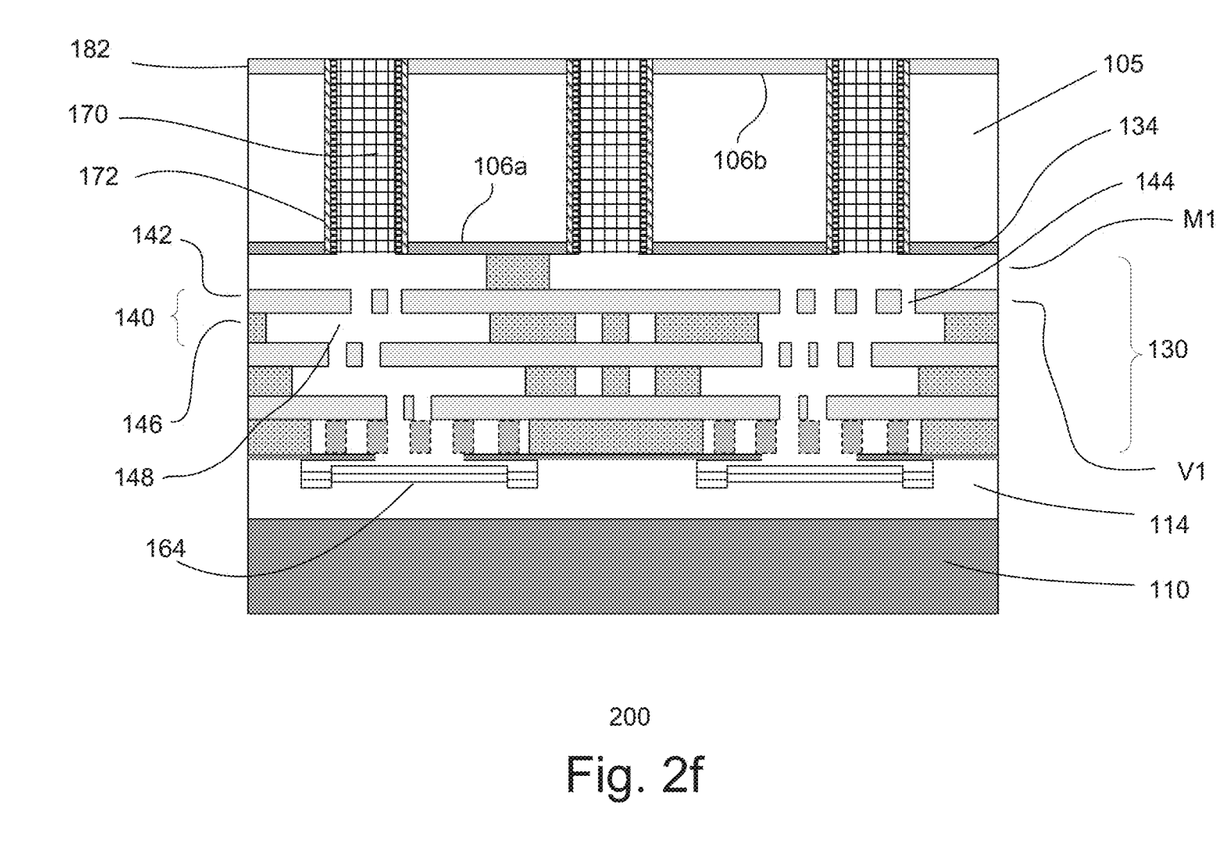

In FIG. 2f, the back side of the substrate is further processed to remove a part of the BOX layer and to expose the bottom surface of the TV contacts. The back side of the substrate, such as the BOX layer 282, is processed by, for example, a debonding process. Alternatively, the backside of the substrate is processed by CMP, RIE or a combination thereof. Other suitable removal techniques may also be useful. This provides a planar surface between the TV contacts and the remaining BOX layer 182.

Figure 2G:
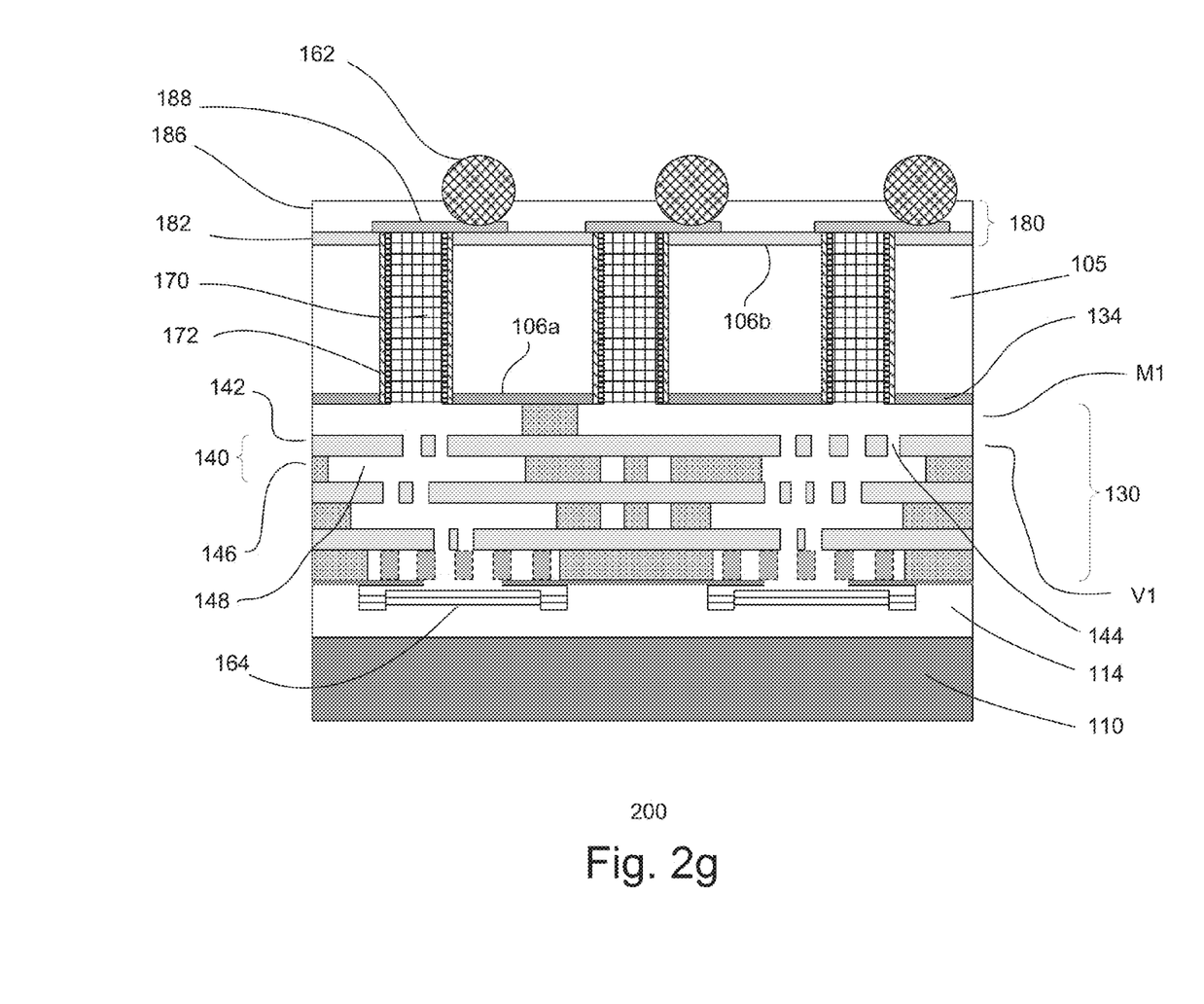

The process continues to form a lower RDL 180. In one embodiment, the remaining BOX layer as described above serves as a first RDL dielectric layer of the lower RDL. Conductive traces 188 and second RDL dielectric layer 186 are formed to complete the lower RDL. For example, a conductive layer is deposited and patterned by, for example, RIE, to form the conductive traces 188. The second RDL dielectric layer is then deposited on the first RDL layer, covering the traces. The second RDL dielectric layer, for example, includes nitride, etc. Other suitable types of dielectric material may also be used for the second RDL layer. Openings are formed in the second RDL dielectric layer using suitable mask and etch technique. Lower contacts 162, such as contact balls, are formed in the openings and connect to the conductive traces.

The process continues to complete the device. For example, the carrier substrate 110 is removed, followed by removal of the adhesive 114. The wafer is then diced to singulate the devices. Additional or other processes may also be performed.

The embodiments as described in FIG. 1 and FIGS. 2a-2g result in advantages. The embodiments as described allow the TV depth to be easily controlled as the insulator layer of the COI substrate, such as the oxide layer, may serve as an etch stop layer during formation of the TV. This enables better TV depth uniformity. The embodiments as described also simplify the process of exposing the bottom surface of the TV contacts as the oxide layer of the COI substrate serves as an etch or CMP stop during the process of exposing the bottom surface of the TV contacts. The remaining oxide layer of the COI substrate also forms part of the RDL dielectric layer. This offers a robust and low cost RDL integration flow. The embodiment as described in FIGS. 2a-2g also provide a simplified process as the remaining oxide layer of the COI substrate serves as a built-in protection layer to the sidewalls of the TV contacts without the need of forming additional protective or insulation layer. In addition, the embodiment as described in FIGS. 2a-2g enables a flat or planar bottom TV contact surface to be directly achieved for backside RDL connection. As such, the backside process integration is much easier and robust.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate, wherein the substrate comprises a buried oxide (BOX) layer sandwiched by a base substrate and a bottom substrate, wherein the BOX layer comprises first and second major surfaces, the first major surface contacts a bottom surface of the base substrate and the second major surface contacts a top surface of the bottom substrate;
   forming a dielectric layer on the base substrate;
   forming through via (TV) contacts within the substrate, wherein the TV contacts are formed in through via openings that extend from a top surface of the dielectric layer to within the BOX layer of the substrate and wherein the through via openings terminate within the BOX layer and at a distance away from the second major surface of the BOX layer which contacts the top surface of the bottom substrate;
   forming upper interconnect levels on the base substrate over a top surface of the TV contacts, wherein the dielectric layer separates the upper interconnect levels from the base substrate;
   providing a carrier substrate over a top surface of the upper interconnect levels; and
   removing the bottom substrate and a portion of the BOX layer, wherein removing the portion of the BOX layer exposes a bottom surface of the TV contacts, and wherein the remaining BOX layer serves as a first redistribution (RDL) dielectric layer of a lower RDL of the device.

2. The method of claim 1 comprising:
   forming conductive traces and a second RDL dielectric layer of the lower RDL of the device over the first RDL dielectric layer, wherein the second RDL dielectric layer contacts the first RDL dielectric layer which is the remaining BOX layer; and
   coupling lower contacts to the conductive traces.

3. The method of claim 2 wherein the conductive traces and second RDL dielectric layer are formed by:
   depositing a conductive layer over the first RDL dielectric layer and patterning the conductive layer to form the conductive traces; and
   depositing the second RDL dielectric layer to cover the conductive traces and contacts the first RDL dielectric layer; and
   patterning the second RDL dielectric layer to form openings exposing the conductive traces.

4. The method of claim 2 wherein the TV contacts extend to at least a thickness of the first RDL dielectric layer within the BOX layer.

5. The method of claim 1 wherein the bottom substrate is removed by an etch process or a backgrinding process.

6. The method of claim 2 wherein the carrier substrate is temporarily attached to the top surface of the upper interconnect levels by an adhesive layer.

7. The method of claim 6 comprising removing the carrier substrate and the adhesive after forming the lower contacts.

8. The method of claim 1 wherein:
   the TV contacts comprise TV liners lining the through via openings formed within the substrate, and
   the TV liners comprise a TV isolation liner and a TV seed layer.

9. The method of claim 1 wherein the carrier substrate facilitates the removal of the bottom substrate and the portion of the BOX layer.

10. The method of claim 1 wherein the portion of the BOX layer is removed by debonding, CMP, RIE or a combination thereof.

11. A method of forming a device comprising:
    providing a crystalline-on-insulator (COI) substrate, wherein the COI substrate comprises at least a base substrate over a buried insulator layer, wherein the buried insulator layer comprises first and second major surfaces, the first major surface contacts a bottom surface of the base substrate and the second major surface of the buried insulator layer is spaced from the bottom surface of the base substrate by an initial thickness of the buried insulator layer;
    forming through via (TV) contacts within the substrate, wherein the TV contacts are formed in through via openings that extend from at least a top surface of the base substrate to within the buried insulator layer and wherein the through via openings terminate within the buried insulator layer and at a distance away from the second major surface of the buried insulator layer;
    forming upper interconnect levels over the top surface of the base substrate; and
    forming a lower redistribution (RDL) over a bottom surface of the base substrate, wherein a portion of the buried insulator layer corresponds to a first RDL dielectric layer of the lower RDL and protects the sidewalls of the TV contacts.

12. The method of claim 11 wherein:
    the COI substrate comprises silicon-on-insulator (SOI) substrate and further comprises a bottom substrate below the buried insulator layer having the initial thickness, wherein the second major surface of the buried insulator layer contacts a top surface of the bottom substrate; and
    the TV contact extends from the top surface of the base substrate to at least a final thickness of the buried insulator layer.

13. The method of claim 12 comprising attaching a carrier substrate over the upper interconnect levels.

14. The method of claim 13 comprising processing the bottom substrate and the buried insulator layer after attaching the carrier substrate, wherein the carrier substrate facilitates the processing of the bottom substrate and the buried insulator layer.

15. The method of claim 14 wherein processing the bottom substrate and the buried insulator layer comprising:
    removing the bottom substrate; and
    removing a portion of the buried insulator layer from the initial thickness to the final thickness, wherein removing the portion of the buried insulator layer forms a planar surface of the buried insulator layer and exposes a bottom surface of the TV contacts.

16. The method of claim 15 wherein the planar surface of the buried insulator layer is substantially co-planar with the bottom surface of the TV contacts.

17. The method of claim 15 wherein:
the bottom substrate is removed by an etch process or a backgrinding process; and
the portion of the buried insulator layer is removed by debonding, CMP, RIE or a combination thereof.

18. The method of claim 15 comprising:
forming conductive traces and a second RDL dielectric layer of the lower RDL over and contact the first RDL dielectric layer; and
coupling lower contacts to the conductive traces.

19. The method of claim 18 comprising removing the carrier substrate after coupling the lower contacts.

20. The method of claim 13 wherein the carrier substrate is temporarily attached to the top surface of the upper interconnect levels by an adhesive layer.

\* \* \* \* \*